(12) United States Patent
Park et al.

(10) Patent No.: US 7,365,495 B2
(45) Date of Patent: *Apr. 29, 2008

(54) FLAT PANEL DISPLAY

(75) Inventors: Sang-Il Park, Seoul (KR); Jae Bon Koo, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/304,894

(22) Filed: Dec. 16, 2005

(65) Prior Publication Data

US 2006/0091816 A1    May 4, 2006

Related U.S. Application Data

(63) Continuation of application No. 10/673,152, filed on Sep. 30, 2003, now Pat. No. 7,002,302.

(30) Foreign Application Priority Data

Oct. 7, 2002  (KR) ............... 2002-61082
Apr. 17, 2003 (KR) ............... 2003-24508

(51) Int. Cl.
*G09G 5/00* (2006.01)
(52) U.S. Cl. ............... 315/169.3; 345/76; 345/84
(58) Field of Classification Search .......... 349/43; 257/52, 72; 315/169.3
See application file for complete search history.

(56) References Cited

U.S. PATENT DOCUMENTS

| 5,543,340 | A | 8/1996 | Lee |
| 5,684,365 | A | 11/1997 | Tang et al. |
| 6,529,213 | B1 | 3/2003 | Kimura |
| 6,788,281 | B2 | 9/2004 | Ando et al. |
| 2004/0207582 | A1 | 10/2004 | Koo et al. |
| 2004/0207583 | A1 | 10/2004 | Koo et al. |

FOREIGN PATENT DOCUMENTS

| CN | 1278635 | | 1/2001 |
| CN | 1279519 | | 1/2001 |
| JP | 2000276075 | | 10/2000 |
| JP | 2000-340798 | | 12/2000 |
| JP | 2001005426 | | 1/2001 |
| JP | 2001-109399 | * | 4/2001 |
| JP | 2001-159878 | | 6/2001 |
| JP | 2002-090708 | | 3/2002 |
| KR | 1020020057538 | | 7/2002 |

OTHER PUBLICATIONS

Liu Chuanzhen, et al.; Si-TFT Active Matrix LCD; Chinese Journal of Liquid Crystals and Displays, vol. 14. No. 2, pp. 137-144.

* cited by examiner

*Primary Examiner*—David H. Vu
(74) *Attorney, Agent, or Firm*—H.C. Park & Associates, PLC

(57) ABSTRACT

The present invention discloses an organic light emitting diode capable of obtaining proper luminance and long life cycle by controlling an amount of current flowing through an organic electroluminescent device per unit pixel. The organic light emitting diode includes a luminescent device and first and second transistors for driving the luminescent device, wherein the first and second transistors have different resistance values. The first transistor is a driving transistor for driving the luminescent device. The second transistor is a switching transistor for switching on and off the driving transistor. The driving transistor may have a higher resistance value than the switching transistor.

9 Claims, 9 Drawing Sheets (PRIOR ART)

(PRIOR ART)

FLAT PANEL DISPLAY

CROSS-REFERENCE TO RELATED APPLICATIONS

This application is a continuation of prior application Ser. No. 10/673,152, filed Sep. 30, 2003, now U.S. Pat. No. 7,002,302, which claims priority to and the benefit of Korean Patent Application No. 2002-61082, filed on Oct. 7, 2002 and Korean Patent Application No. 2003-24508, filed on Apr. 17, 2003, which are all hereby incorporated by reference for all purposes as if fully set forth herein.

BACKGROUND OF THE INVENTION

1. Field of the Invention

The present invention relates to an active matrix flat panel display, more particularly, to an organic light emitting diode capable of generating proper luminance and extending life cycle by controlling the amount of current flowing through an organic electroluminescent (EL) device per unit pixels.

2. Description of Related Art

Although an active matrix organic light emitting diode (AMOLED) that is a flat panel display gradually requires a high-resolution panel, there have been much difficulties fabricating the high-resolution panel due to characteristics of the organic electroluminescent device and the driving transistor for driving the organic electroluminescent device.

For example, in case of a 5″ WVGA AMOLED having pixel size of 45.5 μm×136.5 μm and resolution of 180 ppi or more, luminance of 50 cd/m² per unit area is generated, and it is preferable that a proper amount of current flows to the EL (electroluminescent) device per unit pixel to generate the luminance since luminance per unit area is greatly increased by current amount of the limit value or more if the amount of current flowing to the EL device per unit pixel exceeds a limit value, and the life cycle of the EL device is rapidly decreased accordingly. Therefore, it is preferable that a proper amount of current for generating a certain luminance per unit area flows through the EL device to radiate a pixel, namely, an EL device.

FIG.1 illustrates an equivalent circuit diagram for a unit pixel in a conventional active matrix organic light emitting diode. Referring to FIG. 1, a conventional organic light emitting diode 100 includes unit pixel 150 connected to gate line i 10, data line 120 and common power line 130. The unit pixel 150 includes two p type thin film transistors (TFTs) of switching transistor 151 and driving transistor 155, one capacitor 153 and one organic electroluminescent (EL) device 157.

The switching transistor 151 is driven by scan signals provided to the gate line 110 to switch data signals provided to the data line 120. The driving transistor 155 determines the amount of current flowing through the EL device 157 according to the data signals transmitted through the switching transistor 151, namely, a voltage difference (Vgs) between gate and source. The capacitor 153 plays a role of maintaining a voltage difference (Vgs) between the gate and the source of the driving transistor 155.

FIG. 2 illustrates a plane structure of driving transistor in a conventional organic light emitting diode.

Referring to FIG. 2, a conventional driving transistor comprises a semiconductor layer 220, gate electrode 240 and source/drain electrodes 261 and 265. The semiconductor layer 220 includes a channel region 224 formed on a part corresponding to the gate electrode 240, and high concentration source/drain regions 221 and 225 formed on both sides of the channel region 224. The source/drain electrodes 261 and 265 are electrically connected to the high concentration source/drain regions 221 and 225 through contact holes 251 and 255.

A TFT fabricated using a low temperature polysilicon film is used as the driving transistor, wherein the low temperature polysilicon film is suitable for a current driving type AMOLED (active matrix organic light emitting diode) since the low temperature polysilicon film has a high mobility and a low off current as illustrated in FIG. 9. The amount of current flowing to the EL device through the driving transistor is increased, and luminance is excessively increased since size of pixel is reduced to result in a reduction of size of the anode electrode in an AMOLED of 180 ppi or more. Finally, there are problems in the AMOLED of 180 ppi or more that life cycle of the EL device is reduced as current density per unit area is increased.

Namely, referring to FIG. 9 illustrating a relation of drain current (Id) to gate voltage (Vg) of the driving transistor, the amount of current of 1 μA or more that is about 1-order larger than 90 nA, an on current value suitable for light emitting diodes of 180 ppi or more, flows through the driving transistor 155 in a conventional organic light emitting diode. Therefore, there are problems in that on current of the driving transistor should be reduced to obtain luminance suitable for an AMOLED of 180 ppi or more.

On the other hand, there are problems of high leakage current although the amount of current flowing to the EL device through the driving transistor can be reduced if a thin film transistor (a-Si TFT) formed of amorphous silicon is applied to driving transistor of the AMOLED.

SUMMARY OF THE INVENTION

Therefore, in order to solve the foregoing problems of the prior art, it is an object of the present invention to provide an active matrix organic light emitting diode capable of obtaining proper luminance and extending life cycle.

It is another object of the present invention to provide an active matrix organic light emitting diode capable of obtaining a proper luminance per unit area by controlling the amount of current flowing to an organic electroluminescent device.

It is another object of the present invention to provide an active matrix organic light emitting diode capable of obtaining luminance suitable for display devices by changing resistance value of driving transistor, thereby controlling the amount of current flowing to an organic electroluminescent device.

It is still another object of the present invention to provide a high-speed flat panel display capable of obtaining a proper luminance by switching operating switching transistor at high-speed and controlling current flowing to the organic electroluminescent device by driving transistor.

It is still another object of the present invention to provide an active matrix organic light emitting diode suitable for small-scale high resolution.

In order to achieve the foregoing objects, the present invention provides a flat panel display comprising a luminescent device; and first and second transistors for driving the luminescent device, wherein the first and second transistors have different resistance values.

The first transistor is driving transistor for driving the luminescent device, the second transistor is switching transistor for switching on and off of the driving transistor, and the driving transistor has a higher resistance value than the switching transistor.

A transistor having a higher resistance in the first and second transistors includes multiple gates, a semiconductor layer having high concentration source/drain regions, and an offset region of high resistance formed on the semiconductor layer between the multiple gates.

A transistor having a higher resistance in the first and second transistors includes a gate electrode, high concentration source/drain regions formed on both sides of the gate electrode, and an offset region of high resistance formed between the gate electrode and the drain region.

The offset region is formed in a zigzag shape and is comprised of an impurity region on which low concentration impurities having the same conductivity type as the high concentration source/drain regions are doped as a whole or partially, or an intrinsic region on which impurities are not doped.

The transistor having a higher resistance value in the first and second transistors includes high concentration source/drain regions having different geometrical structure to have different resistance values, and a region connected to the luminescent device in the high concentration source/drain regions has a higher resistance value compared with the other region.

The transistor having a higher resistance in the first and second transistors includes high concentration source/drain regions having different sizes to have different resistance values, and a region connected to the luminescent device in the high concentration source/drain regions has a smaller size compared with the other region. The region connected to the luminescent device in the high concentration source/drain regions of the transistor has the same width and a longer length, or the same length and a narrower width compared with the other region.

Furthermore, the present invention provides a flat panel display comprising R, G and B unit pixels, wherein at least one unit pixel of the R, G and B unit pixels includes at least two or more transistors having source/drain regions, wherein at least drain region in the source/drain regions of at least one transistor in the transistors has a resistance value different from at least drain region of the other transistor.

Furthermore, the present invention provides a flat panel display comprising R, G and B unit pixels, wherein at least one unit pixel of the R, G and B unit pixels includes at least two or more transistors, wherein a gate region of at least one transistor in the transistors has a resistance value different from a gate region of the other transistor.

The drain regions or the gate regions of the at least one transistor and the other transistor have resistance values which are different from each other by doping concentration difference or shape difference of the drain regions or the gate regions. The drain region or gate region of the at least one transistor is a region which is the same conductivity type as the drain region or the gate region of the other transistor, and on which low concentration impurities are doped as a whole or partially, or a region on which impurities are not doped. The drain region or the gate region of the at least one transistor are formed in a zigzag shape and has a longer length, or a narrower width compared with the drain region or the gate region of the other transistor.

The at least one transistor includes a drain region which is an offset region of high resistance, or multiple gates between which an offset region of high resistance is formed.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE INVENTION

Figure 1:
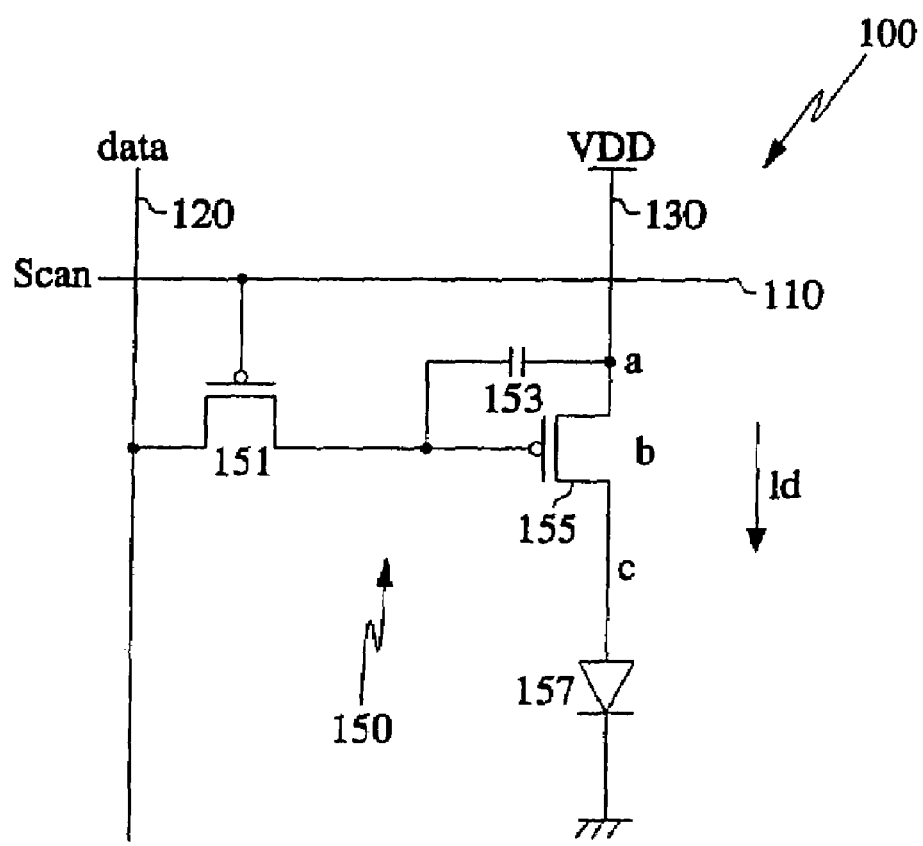
FIG. 1 is an equivalent circuit diagram for unit pixel in a conventional active matrix organic light emitting diode.

The present invention will now be described in detail in connection with preferred embodiments with reference to the accompanying drawings. For reference, like reference characters designate corresponding parts throughout several views.

Figure 3A:
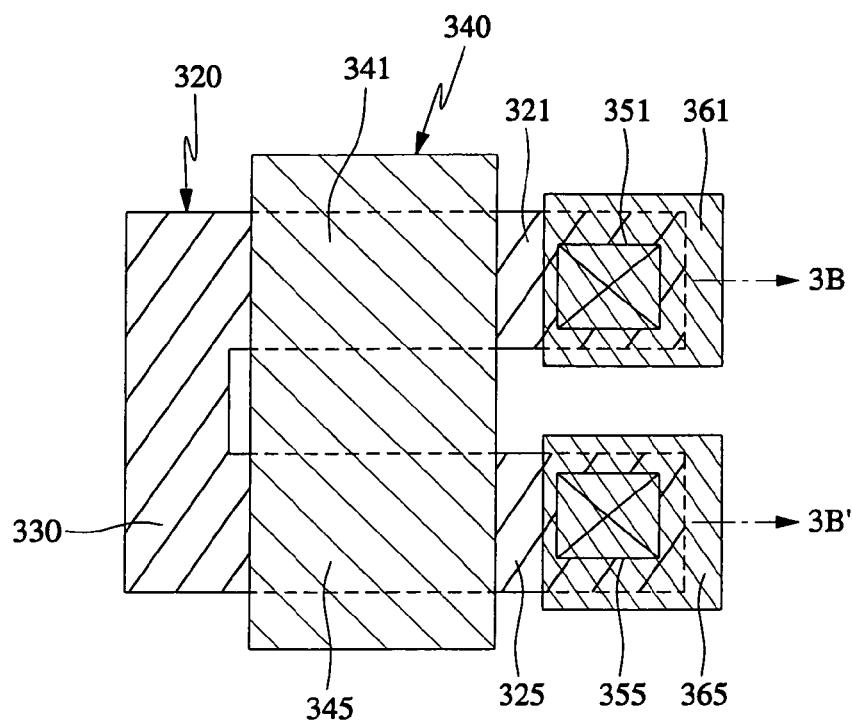
FIG. 3A is a plane structural view of driving transistor including multiple gates in an active matrix organic light emitting diode according to first preferred embodiment of the present invention.
Figure 3B:
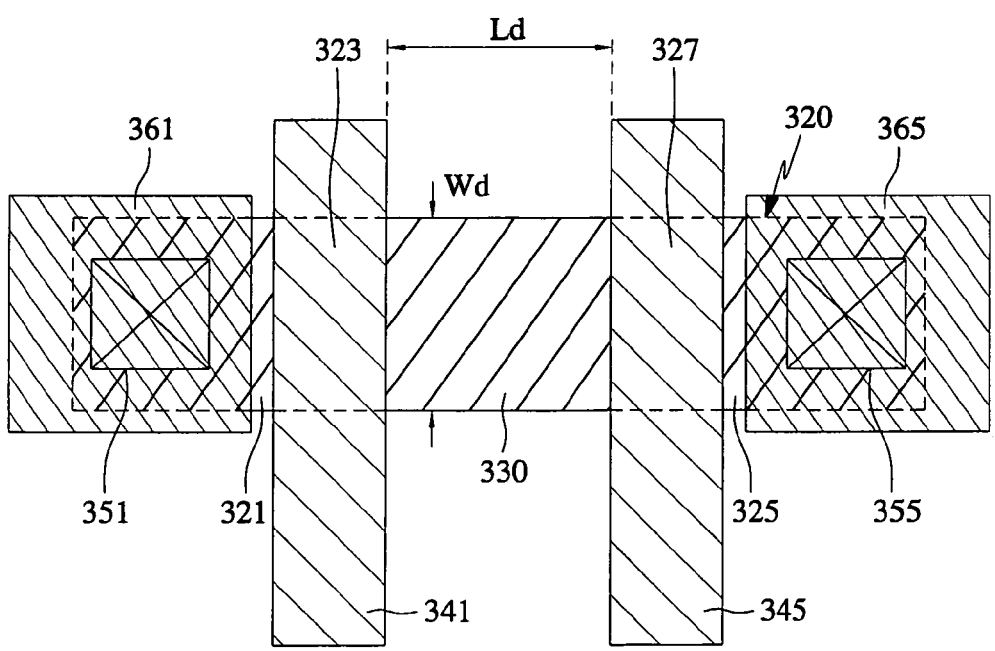
FIG. 3B is a cross section structural view of driving transistor including multiple gates in an active matrix organic light emitting diode according to first preferred embodiment of the present invention.

FIG. 3A to FIG. 3B illustrate plane structure and cross sectional structure of a driving transistor in an organic light emitting diode according to first preferred embodiment of the present invention, wherein the FIG. 3B is a cross sectional view taken along a line 3B-3B' of FIG. 3A. The driving transistor comprises gate electrode formed as multiple gates and offset region that is high resistance region formed on semiconductor layer between the multiple gates to control the amount of current flowing to an EL device.

Referring to FIG. 3A and FIG. 3B, the driving transistor according to the first preferred embodiment of the present invention includes semiconductor layer 320, gate electrode 340, and source/drain electrodes 361 and 365. The gate electrode 340 includes multiple gates 341 and 345 corresponding to the semiconductor layer 320. The source/drain electrodes 361 and 365 are electrically contacted with high concentration source/drain regions 321 and 325 formed on the semiconductor layer 320 through contacts 351 and 355, respectively.

The semiconductor layer 320 includes multiple channel regions 323 and 327 formed on a part corresponding to the multiple gates 341 and 345, the high concentration source/drain regions 321 and 325 formed on one side of the channel layers 323 and 327 and offset region 330 formed between the multiple gates 341 and 345, namely, the multiple channel regions 323 and 327, and has a "⊏" character shaped structure.

The offset region 330 of the high resistance region is comprised of a low concentration impurity region on which impurities having the same conductivity type as the high concentration source/drain regions 321 and 325 are doped in a lower concentration than doping concentration of the source/drain regions 321 and 325, or an intrinsic region on which impurities are not doped.

An electric current (Id) flowing through the driving transistor is decreased, and the amount of current flowing through an EL device 157 is also decreased accordingly since a resistance value between node a and node c of FIG. 1 is increased by the offset region 330 formed between the multiple gates 341 and 345 of the driving transistor when the driving transistor is turned on. Therefore, the driving transistor controls the amount of current flowing through the EL device 157 per unit pixel.

Figure 2:
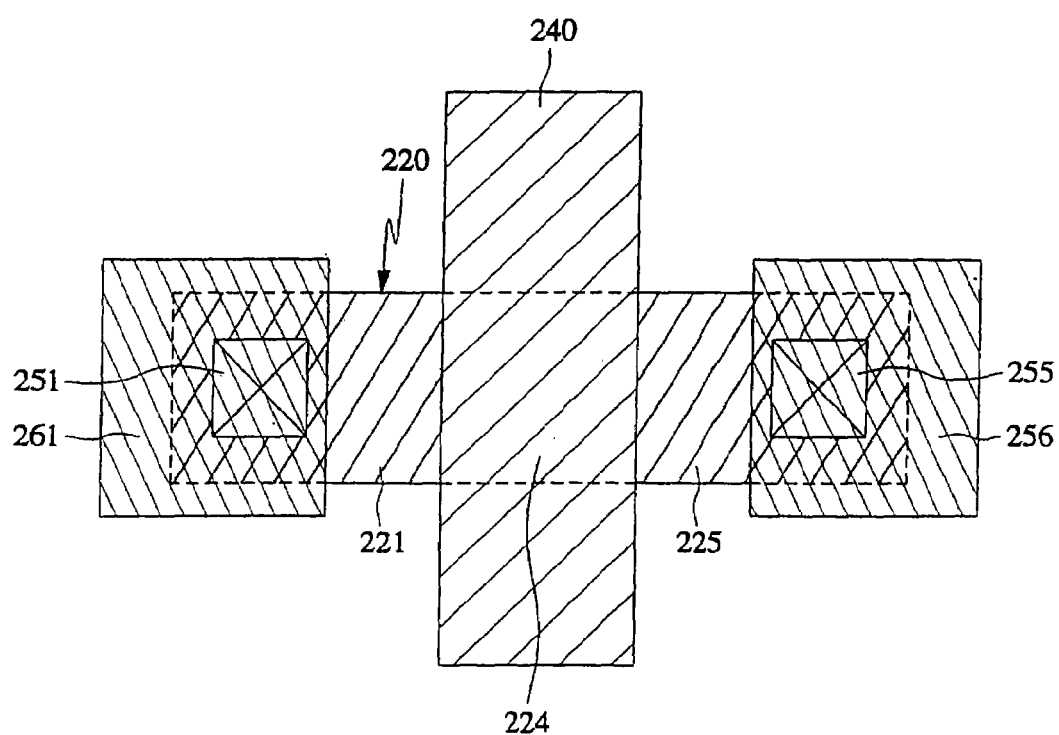
FIG. 2 is a drawing illustrating a plane structure of driving transistor in a conventional active matrix organic light emitting diode.

In an organic light emitting diode according to first preferred embodiment of the present invention, the switching transistor is applied in a structure used in the conventional organic electroluminescent devices, e.g., a structure illustrated as in FIG. 2, and the driving transistor forms the offset region 330 having a high resistance between the multiple gates 341 and 345 as described in the above. Therefore, the amount of current flowing to the EL device is reduced according to size (Wd/Ld) of the offset region 330 or the doping concentration of the offset region 330 as maintaining high speed switching operation as it is in the first preferred embodiment of the present invention.

Figure 4A:
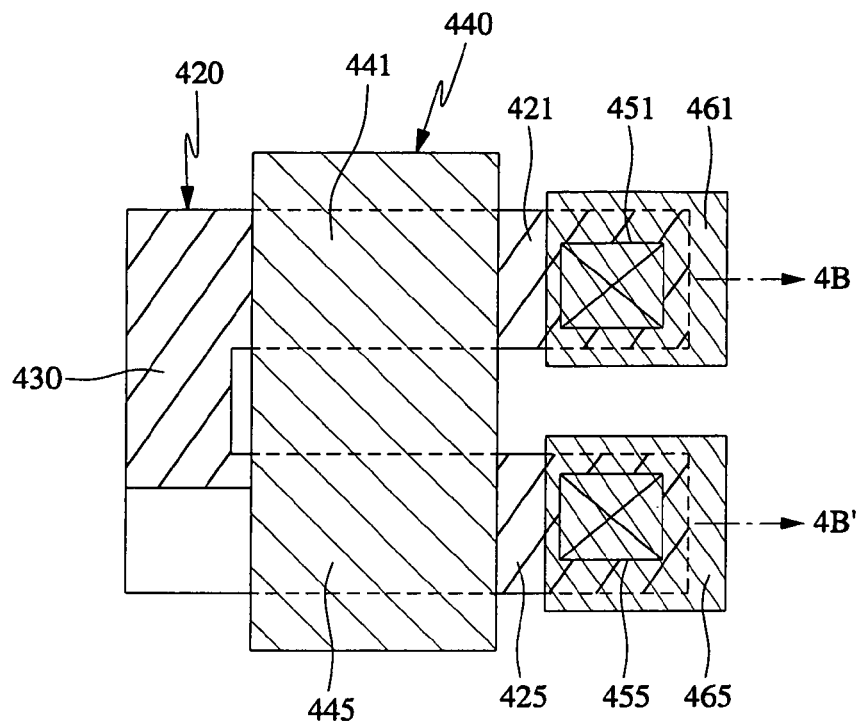
FIG. 4A is a plane structural view of driving transistor including multiple gates in an active matrix organic light emitting diode according to second preferred embodiment of the present invention.
Figure 4B:
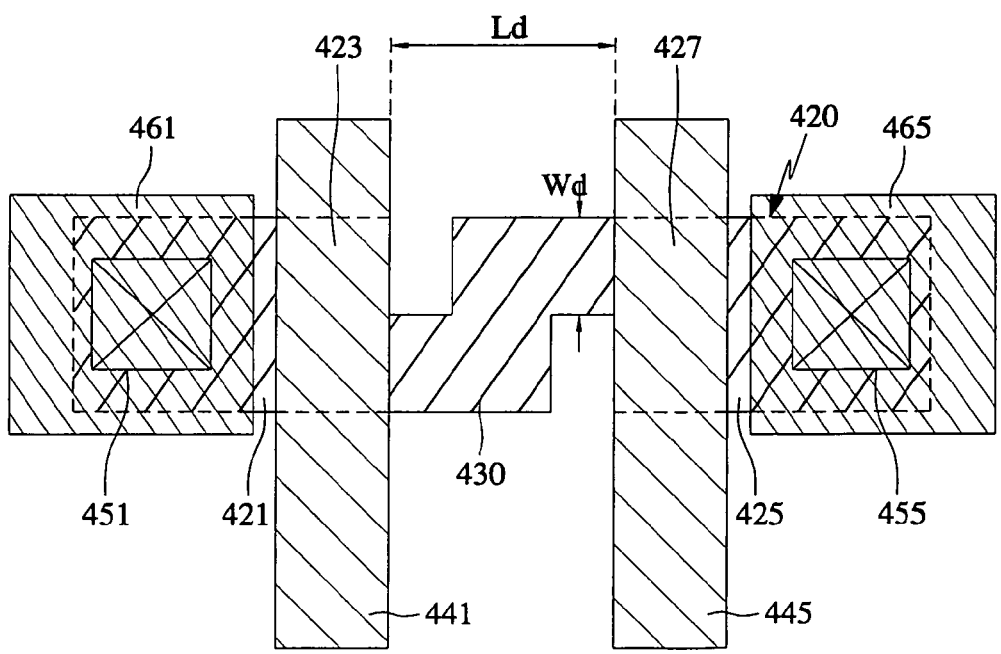
FIG. 4B is a cross section structural view of driving transistor including multiple gates in an active matrix organic light emitting diode according to second preferred embodiment of the present invention.

FIG. 4A and FIG. 4B illustrate plane and cross sectional structures of a driving transistor in an organic light emitting diode according to second preferred embodiment of the present invention, wherein FIG. 4B illustrates a cross sectional view taken along a line 4B-4B' of FIG. 4A. The driving transistor according to the second preferred embodiment controls the amount of current flowing through the EL device by forming multiple gates as a gate electrode and changing shape of an offset region that is a high resistance region between the multiple gates.

Referring to FIG. 4A and FIG. 4B, the driving transistor according to the second preferred embodiment is formed by changing shape of a semiconductor layer 420 and has the almost similar structure to the driving transistor according to the first preferred embodiment illustrated in FIG. 3A and FIG. 3B except that an offset region 430 between multiple gates 441 and 445 is formed in a zigzag shape differently from the first preferred embodiment so that a resistance value of the driving transistor is increased. The zigzag shaped offset region 430 is a high resistance region of a low concentration impurity region on which the same conductivity impurities as high concentration source/drain regions 421 and 425 are doped at a low concentration or an intrinsic region on which impurities are not doped. Furthermore, the zigzag shaped offset region 430 can be formed into a high resistance region on which low concentration impurities having the same conductivity type as the high concentration source/drain regions 421 and 425 are partially doped.

In an organic light emitting diode according to the second preferred embodiment, the amount of current flowing to an EL device is reduced as maintaining high speed switching operation as it is by changing shape of the offset region 430 that is a high resistance region and formed between the multiple gates 441 and 445 of the driving transistor, thereby changing a resistance value of the driving transistor.

Figure 5A:
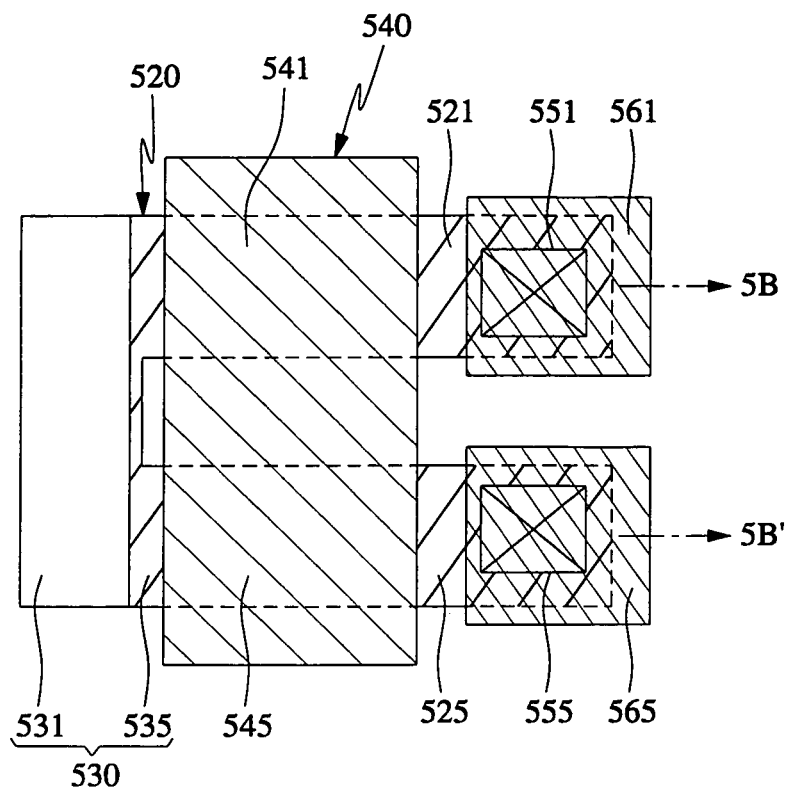
FIG. 5A is a plane structural view of driving transistor including multiple gates in an active matrix organic light emitting diode according to third preferred embodiment of the present invention.
Figure 5B:
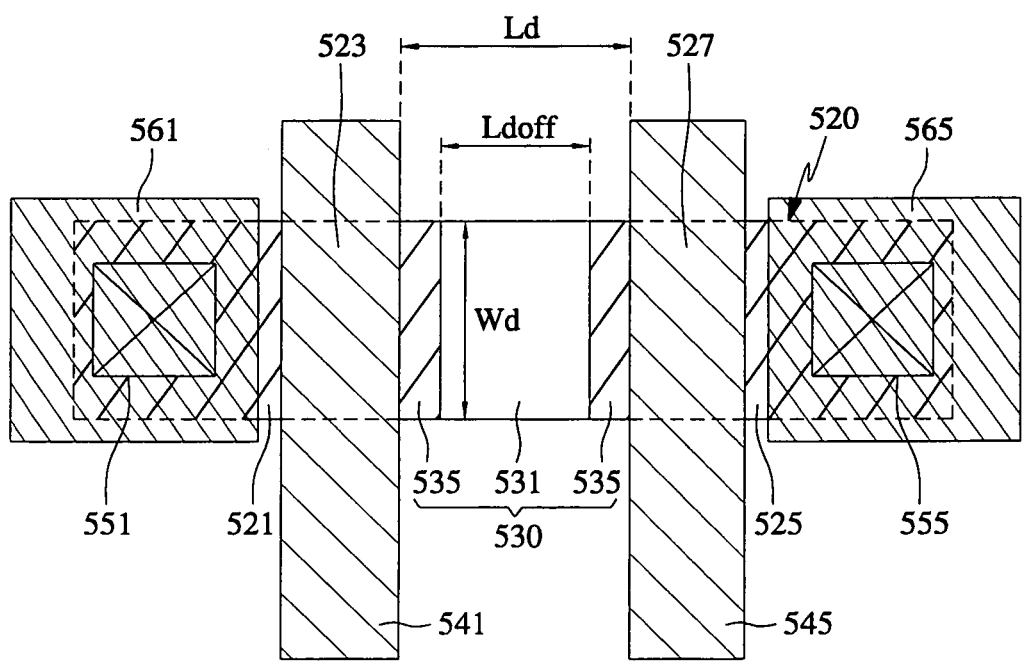
FIG. 5B is a cross section structural view of driving transistor including multiple gates in an active matrix organic light emitting diode according to third preferred embodiment of the present invention.

FIG. 5A and FIG. 5B illustrate plane and cross sectional structures of the driving transistor in an organic light emitting diode according to third preferred embodiment of the present invention, wherein FIG. 5B illustrates a cross sectional view taken along a line 5B-5B' of FIG. 5A. The driving transistor according to the third preferred embodiment controls the amount of current flowing through an EL device by forming multiple gates as a gate electrode and changing the doping state of an offset region that is a high resistance region between the multiple gates.

Referring to FIG. 5A and FIG. 5B, the driving transistor according to the third preferred embodiment in which the doping state of an offset region is changed has the almost similar structure to the driving transistor according to the first preferred embodiment illustrated in FIG. 3A and FIG. 3B except that the offset region 530 between the multiple gates 541 and 545 is partially doped in the third preferred embodiment while an offset region 330 between multiple gates 341 and 345 is doped as a whole or not doped in the first preferred embodiment.

That is, the offset region 530 of the driving transistor according to the third preferred embodiment is consisted of portions 535 on which the same conductivity type low concentration impurities as high concentration source/drain regions 521 and 525 are doped and a portion 531 between the portions 535 on which impurities are not doped.

An organic light emitting diode according to the third preferred embodiment of the present invention reduces the amount of current flowing to an EL device as maintaining high speed switching operation as it is by forming a high resistance offset region 530 on which impurities are partially doped between the multiple gates 541 and 545 of the driving transistor. Therefore, a high-speed display device capable of emitting light to a desired proper luminance according to the doping state of the offset region 530, namely, length of offset (Ldoff) of a portion 531 in the offset region 530 on which impurities are not doped can be realized.

Figure 6A:
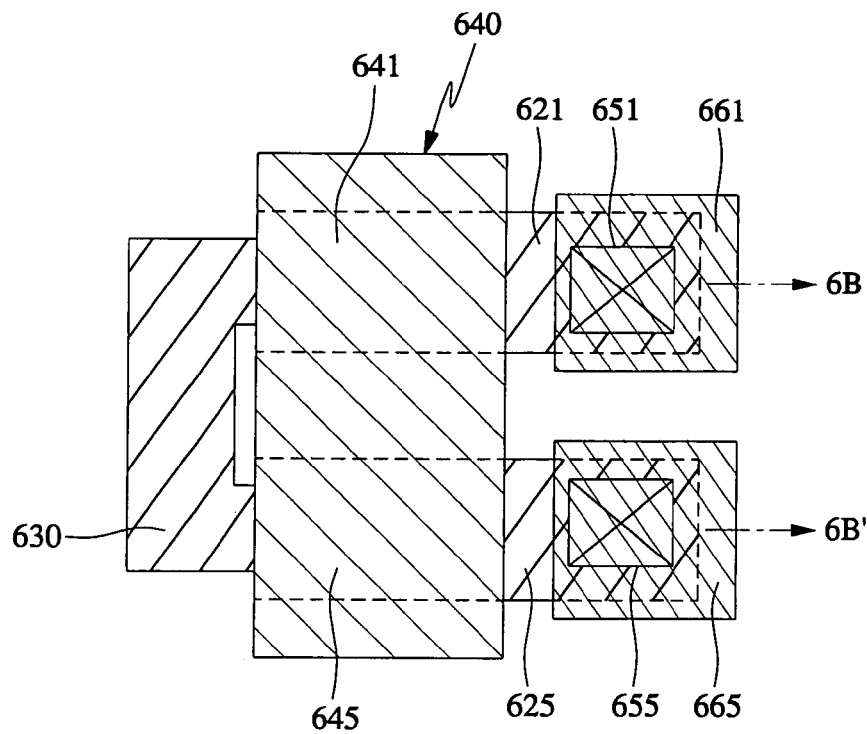
FIG. 6A is a plane structural view of driving transistor including multiple gates in an active matrix organic light emitting diode according to fourth preferred embodiment of the present invention.
Figure 6B:
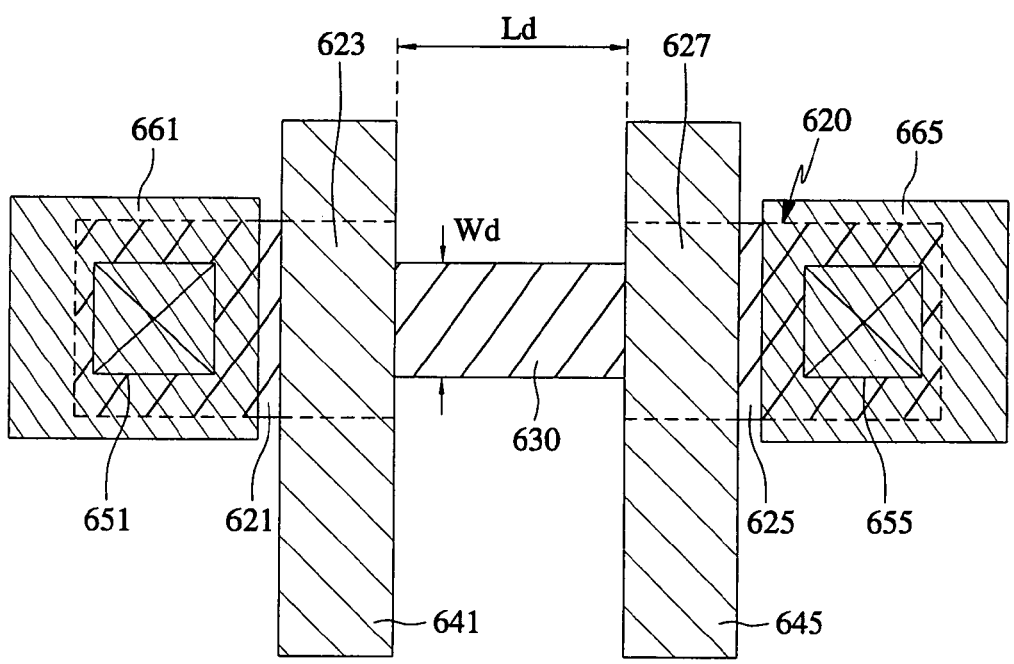
FIG. 6B is a cross section structural view of driving transistor including multiple gates in an active matrix organic light emitting diode according to fourth preferred embodiment of the present invention.

FIG. 6A and FIG. 6B illustrate plane and cross sectional structures of driving transistor in an organic light emitting diode according to fourth preferred embodiment of the present invention, wherein FIG. 6B is illustrates a cross sectional view taken along a line 6B-6B' of FIG. 6A. The driving transistor according to the fourth preferred embodiment of the present invention controls the amount of current flowing through an EL device by forming multiple gates as a gate electrode and changing width of an offset region that is a high resistance region between the multiple gates.

Referring to FIG. 6A and FIG. 6B, the driving transistor according to the fourth preferred embodiment in which width of the offset region is changed has a structure almost similar to the driving transistor according to the first preferred embodiment illustrated in FIG. 3A and FIG. 3B except that the offset region 630 between the multiple gates 641 and 645 has width narrower than that of the offset region 330 of the driving transistor of the first preferred embodiment.

That is, in the offset region 630 of the driving transistor according to the fourth preferred embodiment, a resistance value of the driving transistor is increased by narrowing width compared with the first preferred embodiment as maintaining length (Ld) equally to that in the first preferred embodiment, thereby changing size (Wd/Ld) of the offset region 630, wherein the offset region 630 is a high resistance region on which low concentration impurities having the same conductivity type as high concentration source/drain regions 621 and 625 are doped or not doped.

In an organic light emitting diode according to the fourth preferred embodiment, the driving transistor reduces the amount of current flowing to the EL device as maintaining high speed switching operation of the switching transistor as it is by changing size of the offset region 630 of high resistance formed between the multiple gates 641 and 645 of the driving transistor.

In the driving transistors of the first to fourth preferred embodiments of the present invention, various structures capable of changing resistance values of the driving transistors can be applied to the semiconductor layer and gates although the semiconductor layer is formed in a "⊏" character shaped structure, and the gate electrode is formed as dual gates.

An organic light emitting diode of high switching and low current consumption can be realized in the first to fourth preferred embodiments of the present invention by forming the driving transistor in such a way that the gate region of the transistor has a resistance value different from that of the gate region of the switching transistor by various changes of doping and shape of the offset region, thereby controlling the amount of current flowing to the EL device if gate region of switching transistor is a channel region under the gate, and gate region of driving transistor is an offset region between multiple gates as well as multiple channel regions under the multiple gates.

Figure 7:
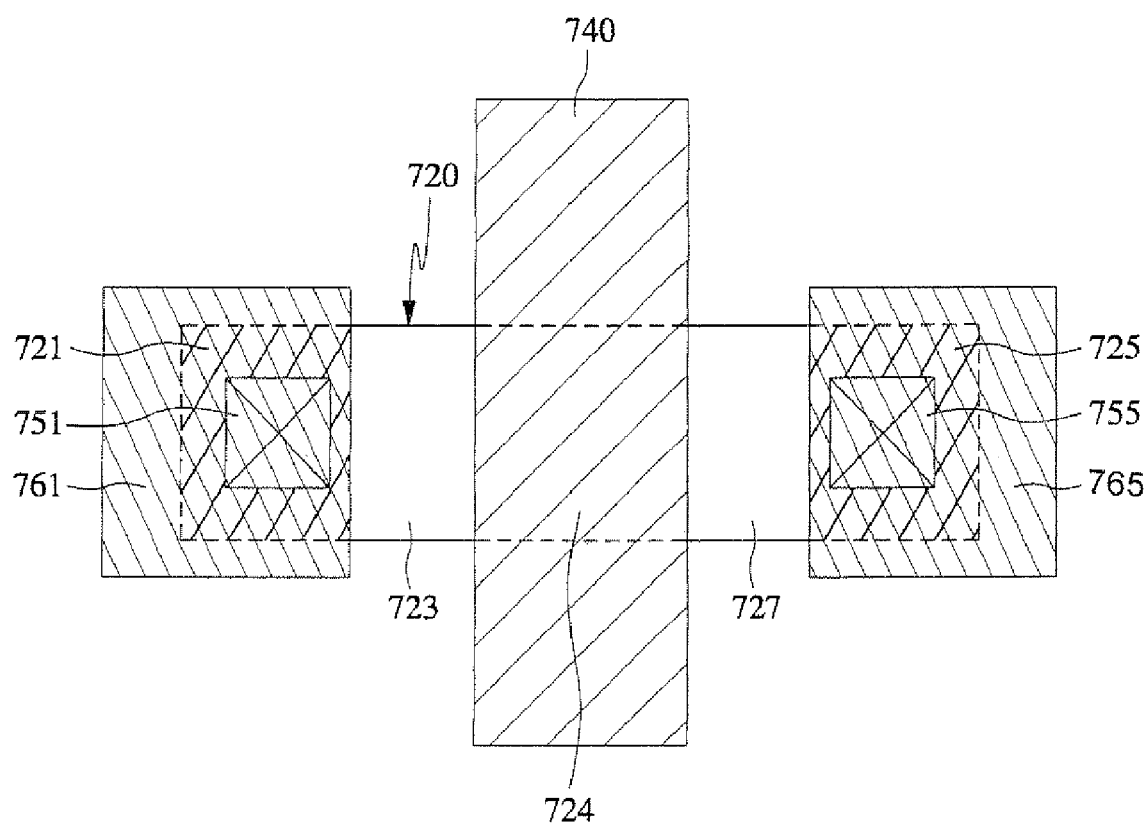
FIG. 7 is a plane structural view of driving transistor including offset region in an active matrix organic light emitting diode according to fifth preferred embodiment of the present invention.

FIG. 7 illustrates a plane structure of driving transistor in an organic light emitting diode according to fifth preferred embodiment of the present invention.

Referring to FIG. 7, the driving transistor according to the fifth preferred embodiment comprises a semiconductor layer 720, a gate electrode 740 and source/drain electrodes 761 and 765. The semiconductor layer 720 comprises a channel region 724 corresponding to the gate electrode 740, and high concentration source/drain regions 721 and 725 formed at both sides of the channel region 724. The high concentration source/drain regions 721 and 725 are electrically contacted with the source/drain electrodes 761 and 765 through contacts 751 and 755.

Furthermore, the semiconductor layer 720 further comprises high resistance offset regions 723 and 727 which are formed between the gate electrode 740 and the source/drain regions 721 and 725 respectively. The offset regions 723 and 727 are a high resistance region comprised of a low concentration impurity region on which low concentration impurities having the same conductivity type as the high concentration source/drain regions 721 and 725 are doped, or an intrinsic region on which impurities are not doped. Furthermore, the offset regions 723 and 727 can be formed in a high resistance region on which low concentration impurities having the same conductivity type as the high concentration source/drain regions 721 and 725 are partially doped.

The driving transistor according to the fifth preferred embodiment reduces the amount of current flowing through an EL device 157 by forming a high resistance region 727 between the gate electrode 740 and the high concentration drain region 725 so that a resistance value of the drain region 725 (node d in FIG. 1) during turning on of the driving transistor is increased, thereby reducing current (Id) flowing through the driving transistor.

In an organic light emitting diode according to the fifth preferred embodiment, the driving transistor reduces the amount of current flowing to the EL device as maintaining high speed switching operation of the switching transistor as it is by changing resistance value of the driving transistor according to size and doping concentration of the high resistance offset regions 723 and 727 of the driving transistor.

Figure 8:
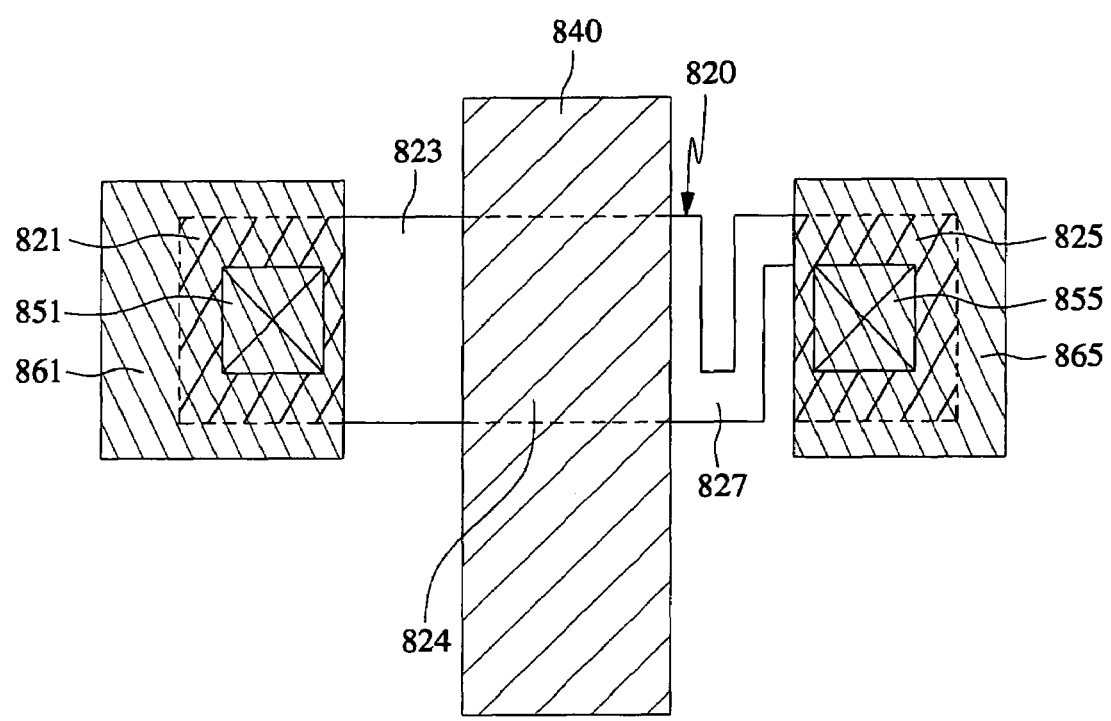
FIG. 8 is a plane structural view of driving transistor including offset region in an active matrix organic light emitting diode according to sixth preferred embodiment of the present invention.
Figure 9:
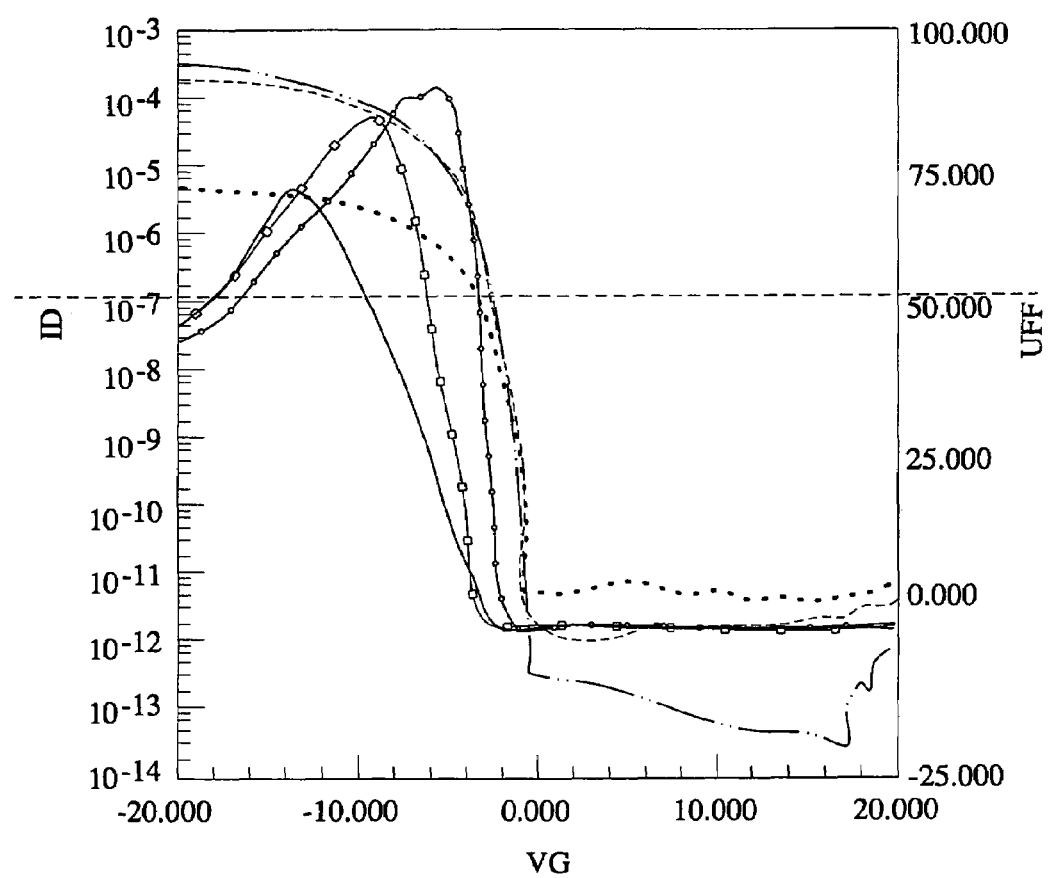
FIG. 9 is a drawing showing driving current for gate voltage of driving transistor in a conventional active matrix organic light emitting diode.

Referring to FIG. 8, the driving transistor in an organic light emitting diode according to sixth preferred embodiment of the present invention has a structure that is almost similar to the driving transistor according to the fifth preferred embodiment illustrated in FIG. 7 except that a drain offset region 827 is formed in a zigzag shape. The drain offset region 827 is a high resistance region comprised of a low concentration impurity region on which the same conductivity type low concentration impurities as the high concentration source/drain regions 821 and 825 are doped, or an intrinsic region on which impurities are not doped.

Furthermore, the zigzag shaped drain offset region 827 can be formed in a high resistance region on which the same conductivity type low concentration impurities as high concentration source/drain regions 821 and 825 are partially doped.

In an organic light emitting diode according to sixth preferred embodiment of the present invention, the driving transistor reduces the amount of current flowing to the EL device as maintaining high speed switching operation of the switching transistor as it is by changing shape of the high resistance offset region 827 of driving transistor, thereby changing a resistance value of the driving transistor.

Although shape is changed by forming an offset region on a drain region in the sixth preferred embodiment of the present invention, a drain resistance value can be changed not by forming the offset region on the drain region, but by changing shape of the drain region in a zigzag shape, or by changing size (W/L) of the drain region.

The offset region is formed on the source/drain regions of the driving transistor in the fifth and sixth preferred embodiments of the present invention, but the offset region can be formed on the drain region only without formation of the offset region on the source region. Furthermore, the drain offset region can be formed in various structures besides the zigzag shape to change resistance value of the drain region.

On the other hand, another method for changing the resistance value of the drain offset region includes a method for changing size, (Wd/Ld), of the drain offset region, wherein the method relatively reduces the amount of current flowing through the drain region by increasing length in the state that width of the offset region is constant or decreasing width in the state that length of the offset region is constant, thereby reducing size (Wd/Ld) of the offset region.

In the fifth to sixth preferred embodiments of the present invention, an organic light emitting diode of high speed switching and low current consumption can be realized by variously changing doping and shape of drain region including the offset region of driving transistor so that the drain region of the driving transistor has a resistance value different from that of the drain region of switching transistor, thereby controlling the amount of current flowing to the EL device.

Although thin film transistors according to the first to sixth preferred embodiments of the present invention are explained on switching transistor and driving transistor composing one pixel as described in the above, the thin film transistors are not only applied to all unit pixels R, G and B composing one pixel, but also applied to a relevant unit pixel only in the R, G and B unit pixels.

In an organic light emitting diode according to the foregoing preferred embodiment of the present invention, the switching transistor is formed of an ordinary polysilicon TFT, and the driving transistor is formed by changing doping concentration or geometrical shape of multiple gates, or changing doping concentration or geometrical shape of the drain region and drain offset region so as to increase a resistance value. Therefore, the switching transistor performs high speed switching operation, and the driving transistor controls the amount of current flowing to the EL device according to the resistance value so as to obtain desired proper luminance. Furthermore, an organic light emitting diode according to the foregoing preferred embodiment of the present invention extends life span of the device by generating appropriate luminance in a flat panel display device as the amount of current flowing to the EL device is being controlled.

Furthermore, an organic light emitting diode according to the foregoing preferred embodiment of the present invention has merits in that reduction problems of opening ratio are solved, and reliability is improved by controlling only the amount of current flowing to an organic electroluminescent device without increasing of an area occupied by the driving transistor per each pixel.

While the invention has been particularly shown and described with reference to preferred embodiments thereof, it will be understood by those skilled in the art that the foregoing and other changes in form and details may be made therein without departing from the spirit and scope of the invention.

The invention claimed is:

1. A flat panel display device, comprising:
a luminescent device;
a first transistor; and
a second transistor,
wherein the first transistor and the second transistor have different resistance values,
wherein the transistor having a higher resistance value in the first transistor and the second transistor includes high concentration source/drain regions having different sizes to have different resistance values, and a region connected to the luminescent device in the high concentration source/drain regions has a smaller size compared with the other region, and
wherein the region connected to the luminescent device in the high concentration source/drain regions of the transistor has a same width and a longer length, or a same length and a narrower width, compared with the other region.

2. The flat panel display of claim 1, wherein the first transistor is a driving transistor for driving the luminescent device, the second transistor is a switching transistor for switching on and off the driving transistor, and the driving transistor has a higher resistance value than the switching transistor.

3. The flat panel display of claim 1, wherein a transistor having a higher resistance value in the first transistor and the second transistor includes multiple gates, a semiconductor layer having high concentration source/drain regions, and an offset region formed on the semiconductor layer between the multiple gates.

4. The flat panel display of claim 1, wherein a transistor having a higher resistance value in the first transistor and the second transistor includes a gate electrode, high concentration source/drain region formed on both sides of the gate electrode, and an offset region formed between the gate electrode and the drain region.

5. The flat panel display of claim 3, wherein the offset region is a high resistance region comprised of a low concentration impurity region on which low concentration impurities having the same conductivity type as the high concentration source/drain regions are doped as a whole or partially doped, or a high resistance region comprised of and intrinsic region on which impurities are not doped.

6. The flat panel display of claim 4, wherein the offset region is a high resistance region comprised of a low concentration impurity region on which low concentration impurities having the same conductivity type as the high concentration source/drain regions are doped as a whole or partially doped, or a high resistance region comprised of an intrinsic region on which impurities are not doped.

7. The flat panel display of claim 3, wherein the offset region is a high resistance region having a zigzag shape.

8. The flat panel display of claim 4, wherein the offset region is a high resistance region having a zigzag shape.

9. The flat panel display of claim 1, wherein a transistor having a higher resistance value in the first transistor and the second transistor includes high concentration source/drain regions having different geometrical structure to have different resistance values, and a region connected to the luminescent device in the high concentration source/drain regions has a higher resistance value compared with the other region.

* * * * *